(12) United States Patent
Shapiro

(10) Patent No.: US 6,693,487 B2
(45) Date of Patent: Feb. 17, 2004

(54) SIGNAL PROCESSING CIRCUIT FOR FLOATING SIGNAL SOURCES USING POSITIVE FEEDBACK

(75) Inventor: Philip D. Shapiro, Palo Alto, CA (US)

(73) Assignee: Finisar Corporation, Sunnyvale, CA (US)

( * ) Notice: Subject to any disclaimer, the term of this patent is extended or adjusted under 35 U.S.C. 154(b) by 336 days.

(21) Appl. No.: 09/925,176

(22) Filed: Aug. 8, 2001

(65) Prior Publication Data

US 2003/0052732 A1 Mar. 20, 2003

(Under 37 CFR 1.47)

(51) Int. Cl.[7] .................................................. H03F 1/38
(52) U.S. Cl. .......................... 330/86; 330/110; 330/112
(58) Field of Search ............................ 330/86, 110, 112, 330/308; 250/214 A

(56) References Cited

U.S. PATENT DOCUMENTS

| | | | |
|---|---|---|---|
| 4,540,952 A | | 9/1985 | Williams ..................... 330/279 |
| 5,012,202 A | * | 4/1991 | Taylor ......................... 330/284 |
| 5,604,463 A | * | 2/1997 | Freuler et al. ............... 330/149 |
| 6,329,881 B1 | * | 12/2001 | Tachigori .................... 330/308 |

OTHER PUBLICATIONS

Integrated Circuits Data Sheet, TZA3013A; TZA3013B, SDH/SONET STM16/OC48, transimpedance amplifier; Objective Specification Jun. 19, 2000.

* cited by examiner

Primary Examiner—Robert Pascal
Assistant Examiner—Henry Choe
(74) Attorney, Agent, or Firm—Pennie & Edmonds LLP

(57) ABSTRACT

A signal processing circuit using positive feedback while keeping the open loop gain of the circuit less than 1 to avoid oscillation. The circuit includes a floating signal source, a low gain amplifier, a feedback element, and a second stage circuit. The floating signal source produces a voltage that is impressed across the feedback element by the feedback system. The feedback element processes the voltage into an output current. The output current is passed through an output current node to the second stage circuit where the output current can be used as a current reference or be further processed. The output from the low gain amplifier may be used as a voltage output node that provides a voltage that is an amplification of the voltage produced by the floating signal source. The signal processing circuit may be embedded in another circuit, including additional stages of the signal processing circuit.

32 Claims, 9 Drawing Sheets

SIGNAL PROCESSING CIRCUIT FOR FLOATING SIGNAL SOURCES USING POSITIVE FEEDBACK

The present invention relates generally to the field of signal processing and particularly to a signal processing circuit for floating signal sources using positive feedback.

BACKGROUND OF THE INVENTION

Floating source signals are normally processed in order to make effective use of the source signal. Normally, negative feedback systems are used to process floating source signals, to linearize the transfer function, and to stabilize the characteristics of the circuit.

Referring to FIG. 1A, a system diagram for a basic feedback system is shown. The feedback system can be implemented with negative or positive feedback to process floating source signals. The feedback system is comprised of a floating signal source 1 coupled to a forward gain circuit 2 and a feedback gain circuit 3. The forward gain circuit 2 has a forward gain of A and includes an input terminal 2a and an output terminal 2b. The feedback gain circuit 3 has a feedback gain of F and includes an input terminal 3a and an output terminal 3b. The gain of the feedback system is calculated as the ratio of voltage at the output terminal 2b to the voltage at the input terminal 2a of the forward gain circuit 2.

Referring to FIG. 1B, a circuit diagram for a conventional negative feedback circuit is shown. A signal from a floating signal source 4 is coupled to a forward gain circuit 9, which in turn is coupled to a feedback gain circuit 6. The forward gain circuit 9 is comprised of an amplifier 5 with a first input terminal 5a coupled to the floating signal source 4, a second input terminal 5b coupled to the feedback gain circuit 6, and an output terminal 5c coupled to the feedback gain circuit 6. The feedback gain circuit 6 includes a first resistor R1 7 and a second resistor R2 8 that are both coupled to the second input terminal 5b of the amplifier 5. The floating signal source 4 produces a voltage $V_{in}$. The forward gain circuit 9 has a forward gain of A and the feedback gain circuit 6 has a feedback gain of F.

The gain of the conventional negative feedback circuit is calculated as the ratio of voltage $V_{out}$ at the output terminal 5c of the amplifier 5, to the voltage $V_{in}$ produced by the floating signal source 4 at the first input terminal 5a of the amplifier 5. For negative feedback systems, the system gain $V_{out}/V_{in}$ is equal to $A/(1+FA)$. The equation for the system gain of a negative feedback system is shown by the following equations and analysis. Referring to FIG. 1B:

$$F = R2/(R1+R2) \quad \quad 1.$$

where F is the feedback gain of the feedback gain circuit 6, R1 is the value of the first resistor 7, and R2 is the value of the second resistor 8.

$$G = V_{out} * F \quad \quad 2.$$

where G is the voltage at point G and $V_{out}$ is the voltage at the output terminal 5c of the amplifier 5.

$$V_{out} = (V_{in} - G) * A \quad \quad 3.$$

where $V_{in}$ is the voltage produced by the floating signal source 4 and A is the the forward gain of the amplifier 5. Therefore, using equations 2 and 3:

$$V_{out} = [V_{in} - (V_{out} * F)] * A$$
$$V_{in} * A = V_{out} * (1+FA)$$
$$V_{out}/V_{in} = A/(1+FA)$$

The forward gain A is typically much greater than 1 for negative feedback systems, and can often be in the range of $10^5$ or $10^6$. Therefore, the system gain can be approximated as A/FA or 1/F.

If, for example, the feedback gain circuit 6 consists of a resistor divider including the first resistor R1 7 with a resistance value of 9R and the second resistor R2 8 with a resistance value of 1R, then the feedback gain F would be equal to 1/10, thereby, producing a system gain of 1/F or 10. By choosing appropriate resistance values, other values for the feedback gain F and the system gain may be obtained.

High gain operational amplifiers are commonly used as the forward gain circuit in negative feedback systems. However, operational amplifiers are complex and slow since a signal must pass through several stages of transistors. The speed of the circuit is degraded with each stage. The speed of operational amplifiers is also degraded by the integrating capacitor used to stabilize the amplifier.

Another disadvantage of negative feedback systems is that they are prone to instability or oscillation. Oscillation will occur if there is a frequency where the open loop gain of the feedback system is greater than one and the signal passing through the feedback system is phase shifted 360 degrees. The open loop gain of the feedback system is determined by the product of the forward gain A and the feedback gain F. In negative feedback systems, there is a chance of oscillation since the forward gain A is almost always much greater than 1, and therefore the open loop gain will almost always be greater than 1.

Also, since the signal inversion of the negative feedback system gives the equivalent of a 180 degree shift and the operational amplifier used in negative feedback systems provides a 90 degree phase shift at all frequencies, if the feedback gain circuit 3 provides an additional 90 degree phase shift, the negative feedback system will oscillate. Although a feedback gain circuit consisting of only resistors will not cause a phase shift, any feedback gain circuit containing a capacitor may cause a 90 degree phase shift in the signal and cause oscillation.

Negative feedback circuits can also contribute a significant amount of noise due to the resistors typically used in negative feedback circuits. Transistors used in amplifiers also contribute noise. A major source of transistor noise can be modeled as a current source between the collector and emitter wherein a larger current contributes more noise.

A final disadvantage of negative feedback systems is that many operational amplifiers have a constant gain-bandwidth product (i.e., the product of the closed loop gain and the closed loop bandwidth equals a constant) and therefore must trade-off a high gain characteristic with a narrower bandwidth.

Positive feedback systems, on the other hand, are usually avoided in signal processing because they will oscillate or latch up if the open loop gain is greater than 1, which makes it difficult to design such systems to produce an adequate gain. This is because positive feedback systems inherently have a 360 degree phase shift.

Therefore, it is an object of this invention to provide a processing circuit for floating source signals that has greater speed, simplicity, stability, reduced noise, and increased bandwidth over the existing methods.

SUMMARY OF THE INVENTION

The present invention comprises a positive feedback signal processing circuit having an open loop gain of less than 1 to avoid oscillation. The signal processing circuit includes a floating signal source, a forward gain circuit comprising a low gain amplifier, and a feedback gain circuit comprising a feedback element and a second stage circuit. The floating signal source produces a voltage that is impressed across the feedback element by the feedback system. The feedback element converts the voltage into an output current. The output current is forced through an output current node to the second stage circuit where the output current can be used as a current reference or be further processed (e.g., amplified to a useable level).

The output from the low gain amplifier may be used as a voltage output node that provides a voltage that is an amplification of the voltage produced by the floating signal source. The signal processing circuit may be embedded in other circuits, including additional stages of the signal processing circuit, to create more complex functions and to create another stage of gain.

The signal processing circuit of the present invention has several uses including use as a floating voltage source amplifier, a current amplifier, a voltage source to current source converter, and can also be used for analog signal processing functions (e.g., integration, differentiation, exponentiation, and logarithms). The circuits of the present invention can be manufactured using gallium arsenide (GaAs) metal-semiconductor field-effect transistor (MESFET) processes and bipolar and complementary metal-oxide silicon or BiCMOS processes.

The signal processing circuit of the present invention is built around a high speed, low gain amplifier, providing high speed operation, high bandwidth and low noise. The signal processing circuit of the present invention is also completely stable since it operates with an open loop gain of less than 1, thereby avoiding the possibility of oscillation.

BRIEF DESCRIPTION OF THE DRAWINGS

Additional objects and features of the invention will be more readily apparent from the following detailed description and appended claims when taken in conjunction with the drawings, in which:

DETAILED DESCRIPTION OF THE PREFERRED EMBODIMENTS

Figure 1A:
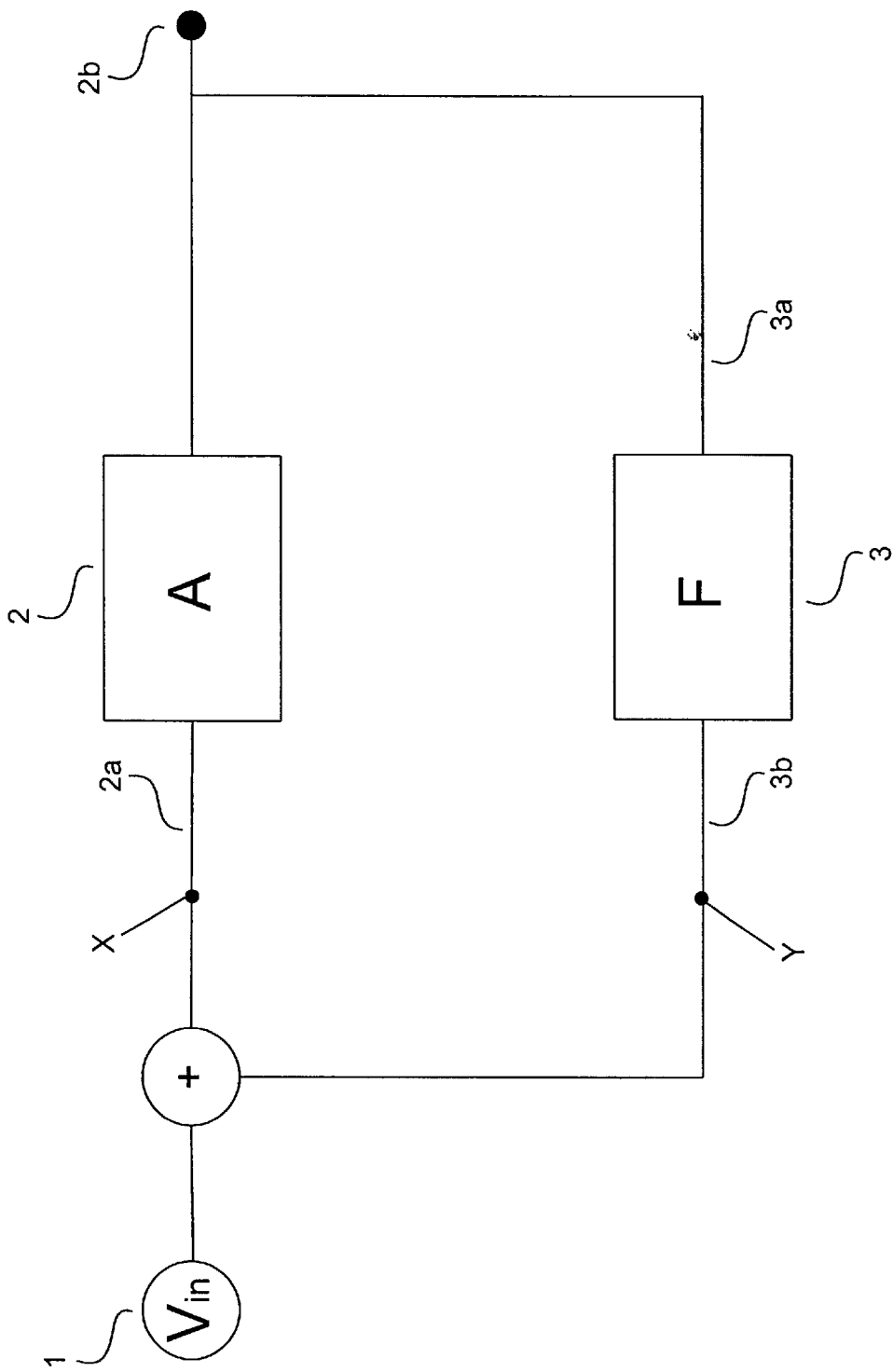
FIG. 1A is a diagram of a feedback system that can be implemented in either positive or negative feedback mode.

FIG. 1A shows a feedback system that can be implemented with negative or positive feedback to process floating source signals. As stated above, the feedback system is comprised of a forward gain circuit 2 with a forward gain of A coupled to a feedback gain circuit 3 with a feedback gain of F. The forward gain circuit 2 includes an input terminal 2a and an output terminal 2b.

The gain of the feedback system is calculated as the ratio of voltage at the output terminal 2b to the voltage at the input terminal 2a of the forward gain circuit 2. For negative feedback systems, the system gain is equal to $A/(1+FA)$. Negative feedback systems have been extensively used in the prior art as described above.

Figure 2:
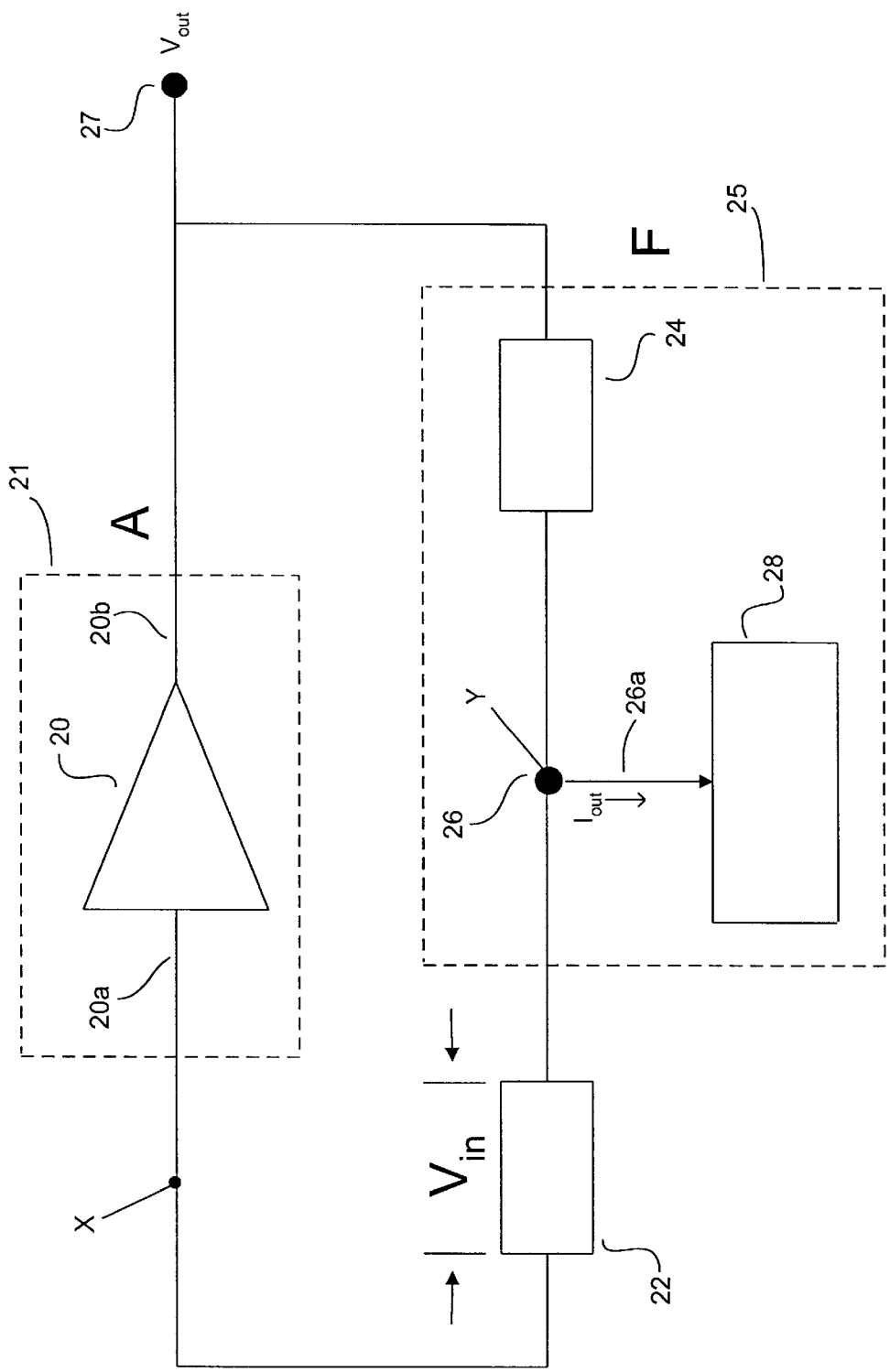
FIG. 2 is the general circuit layout for a signal processing circuit using positive feedback in accordance with the present invention.

The present invention offers a circuit architecture for implementing a positive feedback system. Referring to FIG. 2, the general circuit layout for a signal processing circuit using positive feedback in accordance with the present invention is shown. The signal processing circuit is built around a forward gain circuit 21 with a forward gain of A. The forward gain circuit 21 comprises a low gain amplifier 20 with a high impedance input terminal 20a and an output terminal 20b. The input terminal 20a of the low gain amplifier 20 is coupled to a floating signal source 22 while the output terminal 20b of the low gain amplifier 20 is coupled to a feedback gain circuit 25 with a feedback gain of F. The floating signal source 22 produces a voltage $V_{in}$.

The feedback gain circuit 25 is comprised of a feedback element 24 and a second stage circuit 28. The floating signal source 22 and feedback element 24 are coupled at an output current node 26 from which an output current of $I_{out}$ 26a flows to the second stage circuit 28. Alternately, or in addition, the output terminal 20b of the low gain amplifier 20 is coupled to an output voltage node 27 that has an associated output voltage $V_{out}$.

The system gain ($V_{out}/V_{in}$) of a basic positive feedback system is equal to $A/(1-FA)$. The equation for the system gain of a positive feedback system is shown by the following equations and analysis. Referring back to FIG. 1A:

$$Y = V_{out} * F \qquad 1.$$

where Y is the voltage at point Y and $V_{out}$ is the voltage at the output terminal 2b of the forward gain circuit 2.

$$X = (V_{out} * F) + V_{in} \qquad 3.$$

where X is the voltage at point X and $V_{in}$ is the voltage produced by the floating signal source 1.

$$V_{out} = X * A \qquad 4.$$

where A is the forward gain of the forward gain circuit 2. Therefore, using equations 3 and 4:

$$V_{out} = [(V_{out} * F) + V_{in}] * A$$

$$V_{in} * A = V_{out} * (1 - FA)$$

$$V_{out}/V_{in} = A/(1 - FA)$$

Figure 1B:
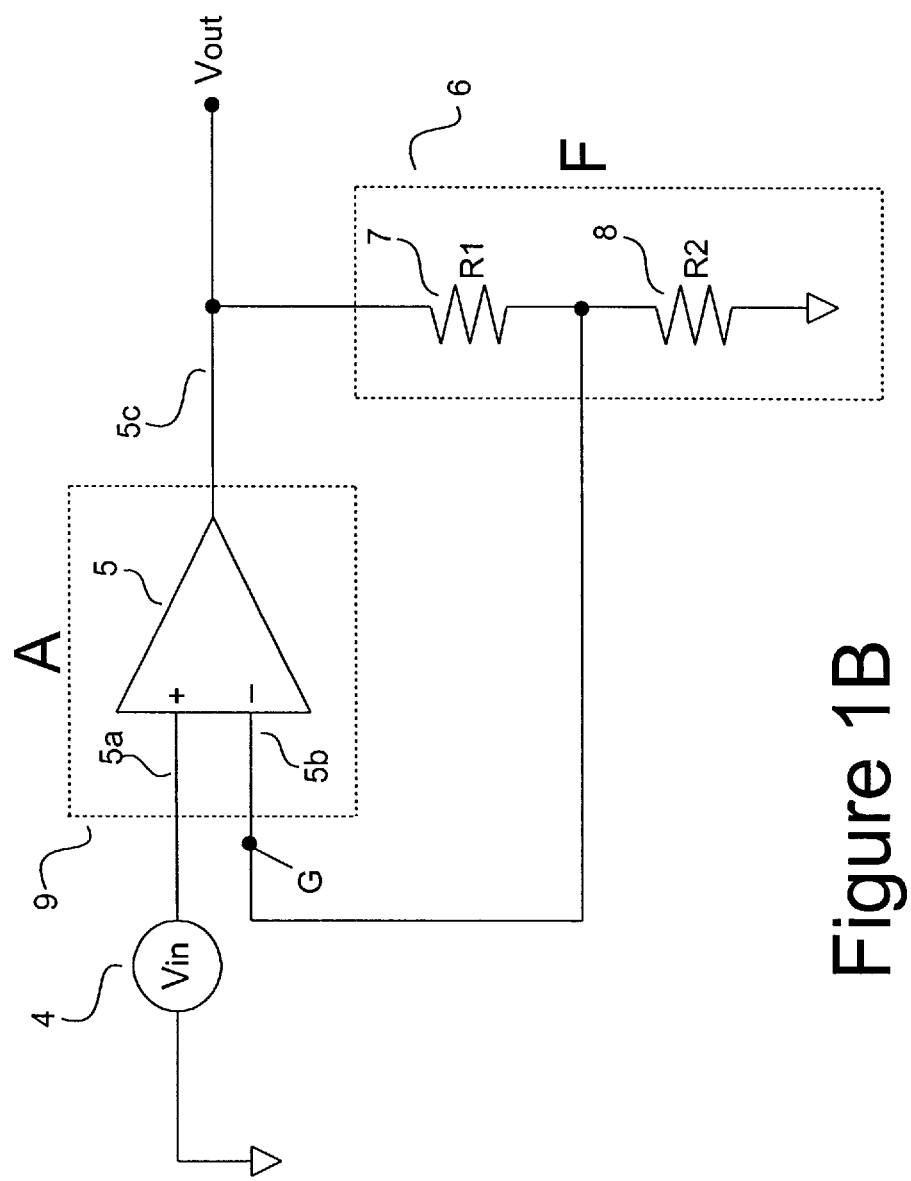
FIG. 1B is the general circuit layout for a conventional negative feedback circuit used for signal processing.

As shown in FIG. 1A, the forward gain circuit 2 of a basic negative or positive feedback system receives two inputs signals: one input signal is received from the floating signal source 1 and another input is received from the feedback gain circuit 3. As shown in FIG. 1B, the forward gain circuit 9 of the conventional negative feedback circuit also receives two inputs: one input signal is received from the floating signal source 4 and another input signal is received from the feedback gain circuit 6. As shown in FIG. 2, the forward gain circuit 21 of the positive feedback circuit of the present invention receives only one input signal. Nevertheless, the positive feedback circuit of the present invention can be made to conform to the basic positive feedback system model, as shown by the following equations and analysis. Referring to FIG. 2:

$$F = R2/(R1+R2) \quad \quad 1.$$

where F is the feedback gain of the feedback gain circuit 25, R1 is the resistance value of the feedback element 24, and R2 is the resistance value of the second stage circuit 28.

$$Y = V_{out} * F \quad \quad 2.$$

where Y is the voltage at point Y and $V_{out}$ is the voltage at the output terminal 20b of the low gain amplifier 20.

$$X = (V_{out} * F) + V_{in} \quad \quad 3.$$

where X is the voltage at point X and $V_{in}$ is the voltage produced by the floating signal source 22.

$$V_{out} = X * A \quad \quad 4.$$

where A is the forward gain of the low gain amplifier 20. Therefore, using equations 3 and 4:

$$V_{out} = [(V_{out} * F) + V_{in}] * A$$

$$V_{in} * A = V_{out} * (1 - FA)$$

$$V_{out}/V_{in} = A/(1-FA)$$

Therefore, as for the basic positive feedback system, the system gain ($V_{out}/V_{in}$) of the positive feedback circuit of the present invention is also equal to $A/(1-FA)$.

If, for example, the feedback gain circuit 25 includes the feedback element 24 with a resistance value of 1R and the second stage circuit 28 with a resistance value of 9R, the feedback gain F is equal to 9/10. If the forward gain circuit 21 consists of a unity gain amplifier, the forward gain A is equal to 1. These values for the feedback gain F and the forward gain A correspond to a system gain of 10.

The open loop gain of a feedback system is defined to be the product of the forward gain A and the feedback gain F. In the present invention, the forward gain circuit preferably consists of a low gain amplifier with a gain greater than or equal to 0.5 and less than or equal to 2. Since the forward gain circuit consists of a low gain amplifier, the open loop gain can easily be kept lower than 1 by using an appropriate feedback gain circuit. For example, if a low gain amplifier with a gain of 2 is used for the forward gain circuit, the open loop gain can still be kept less than 1 by using a feedback gain circuit having a gain of less than 0.5.

A unity gain amplifier is especially effective in the forward gain circuit 21 of the present invention since an open loop gain of less than 1 can be achieved by combining the unity gain amplifier with any feedback gain circuit having a gain of less than 1. Feedback gain circuits with a gain of less than 1 are easily constructed since feedback gain circuits using only passive elements very often have a gain of less than 1. If the open loop gain of the system is less than 1 at all frequencies, then it is impossible for the feedback system (and thus the signal processing circuit) to latch up or oscillate.

The low gain amplifier 20 of the present invention may have a gain greater than or equal to 0.5 and less than or equal to 2 and may consist of a single transistor (such as an emitter follower), more than one transistor (such as a Darlington pair), or an operational amplifier connected as an unity gain buffer. The floating signal source 22 may be a floating voltage source, such as a sensor, microphone, or disk drive sensor. Alternately, the floating signal source may be a floating current source, such as a photo diode, that is configured (e.g., by combining it with a capacitor or other circuit element) to produce a voltage. The feedback element 24 may consist of capacitors, inductors, resistors, diodes, or any combination of the above.

If the low gain amplifier 20 is an emitter follower, it will have an offset voltage between its output and its input. In most embodiments, this offset voltage should be compensated for by using a transistor in series with the input of the low gain amplifier 20, where the additional transistor is configured to compensate for the amplifier's offset voltage. A compensating transistor should also be used when a precision circuit is desired. In GaAs processes, a typical low gain amplifier has a voltage offset of 0.3V whereas, in bipolar processes, a typical low gain amplifier has a voltage offset of 0.6V to 1V. The offset voltage may be compensated using a transistor to produce an equal offset voltage in the opposite direction of the voltage offset of the low gain amplifier 20. If the feedback element 24 is a capacitor, no compensation is needed since the voltage offset of the low gain amplifier 20 is canceled by the differentiation function of the capacitor.

In accordance with the present invention, the floating signal source 22 produces a voltage V that is impressed across the feedback element 24 by the feedback system. The feedback element 24 processes the voltage V into an output current $I_{out}$ 26a. The output current $I_{out}$ 26a is passed through the output current node 26 to a second stage circuit 28. The type of processing performed on voltage V to produce the output current $I_{out}$ 26a depends on the feedback element used.

If the feedback element 24 is a capacitor, then voltage V is differentiated to develop the output current $I_{out}$ 26a, as shown below in an embodiment of the present invention. If the feedback element 24 is an inductor with an inductance value of L, voltage V is integrated by the feedback element 24 with the value of the output current $I_{out}$ 26a being determined by the equation $$I_{out} = \frac{1}{L}\int V.$$

If the feedback element 24 is a resistor with a resistance value of R, voltage V is divided by the feedback element 24 with the value for the output current $I_{out}$ 26a being determined by the equation $I_{out} = V/R$. If the feedback element 24 is a diode, voltage V is exponentiated by the feedback element 24 with the value for the output current $I_{out}$ 26a being determined by the equation $$I_{out} = I_S e^{(qV/kT)}$$

where $I_S$ is a constant, q is the charge of an electron, k is Boltzmann's constant, and T is temperature in kelvin.

The output current $I_{out}$ 26a created by the feedback element 24 does not flow back into the floating signal source 22 due to the high input impedance of the low gain amplifier 20. Therefore, the output current $I_{out}$ 26a flows to a second stage circuit 28, preferably with a low impedance, where it can be further amplified to a useable level or be used as a current reference or a bias line since the output current $I_{out}$ 26a is a voltage independent current source.

Figure 3:
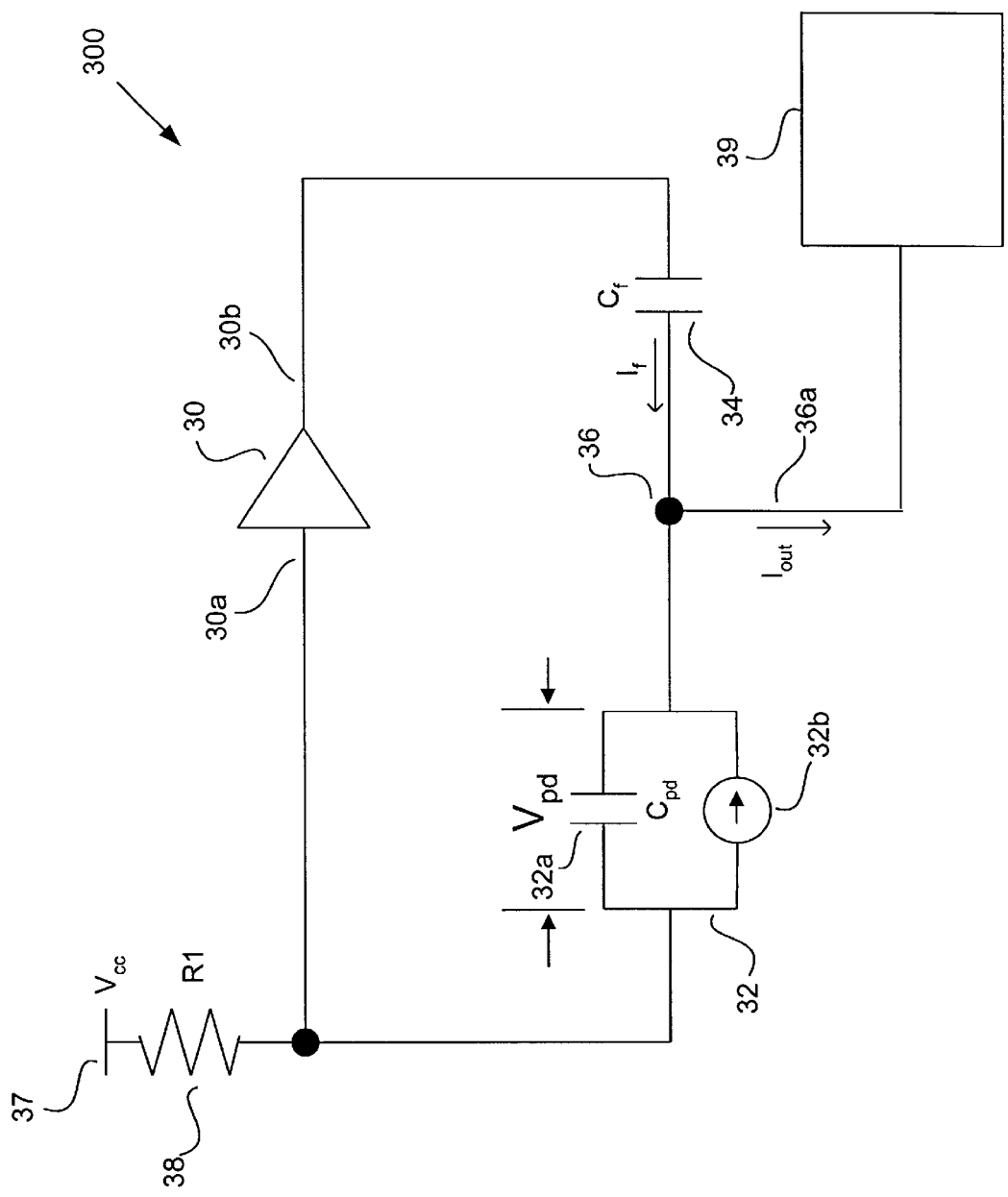
FIG. 3 is a diagram of a photo diode amplifier utilizing a photo diode as the floating signal source and a capacitor as the feedback element in accordance with the present invention.

Referring to FIG. 3, a photo diode amplifier 300 in accordance with the present invention is shown. The photo diode amplifier has a low gain amplifier 30, which includes an input terminal 30a and an output terminal 30b, a photo diode 32 as a floating signal source, and a capacitor $C_f$ 34 as a feedback element. The photo diode 32 is represented in FIG. 3 by its equivalent circuit model, which includes a capacitor $C_{pd}$ 32a in parallel with a current source $I_{pd}$ 32b. The photo diode 32 and capacitor $C_f$ 34 are coupled at an output current node 36. Although not shown in FIG. 3, an inductor may be coupled between the capacitor $C_f$ 34 and the output current node 36 to compensate for the inductance inherent in the photo diode 32 (e.g., caused by bond wires within a transistor outline package containing the photo diode.)

A resistor R1 38 is coupled between a power supply $V_{cc}$ 37 and the input 30a of the low gain amplifier 30.

The photo diode's current, $I_{pd}$, is integrated by its own capacitance, $C_{pd}$, to produce a voltage of value $V_{pd}$ where $V_{pd}$ is expressed as:

$$V_{pd} = \frac{1}{C_{pd}} \int I_{pd}.$$

Because this circuit uses positive feedback, the voltage across the photo diode, $V_{pd}$, is impressed or forced across the feedback capacitor $C_f$. The voltage across the feedback capacitor, $V_f$, is therefore equal to $V_{pd}$ and can be expressed as:

$$V_f = V_{pd} = \frac{1}{C_{pd}} \int I_{pd}.$$

The voltage $V_f$ across the feedback capacitor is differentiated by the feedback capacitor $C_f$ to develop a feedback current $I_f$ that can be represented by the following equations:

$$\begin{aligned} I_f &= C_f \frac{d}{dt} V_f \\ &= C_f \frac{d}{dt} \frac{1}{C_{pd}} \int I_{pd} dt \\ &= \frac{C_f}{C_{pd}} I_{pd}. \end{aligned}$$

Therefore, feedback current $I_f$ is equal to the photo diode current $I_{pd}$ amplified by a factor of $C_f/C_{pd}$. The current $I_f$ produced by the feedback element does not flow back into the photo diode due to the high input impedance of the low gain amplifier 30. Therefore, current $I_f$ flows out of the output current node 36 to a low impedance second stage circuit 39 as current $I_{out}$ 36a. The second stage circuit 39 balances the voltage accumulation on the feedback capacitor $C_f$ 34 due to the photo diode 32 by drawing current from the photo diode amplifier circuit, allowing the voltage across the feedback capacitor 34 to be balanced at a continuous and safe level.

The photo diode amplifier circuit of FIG. 3 contributes very little noise since the feedback element is a capacitor, which is noiseless. There is no resistor noise since there is no feedback resistor, unlike most conventional pre-amplifiers. Noise is contributed only by the low gain amplifier 30. Since the first stage amplifier circuit determines the sensitivity of the entire circuit and since noise can not be removed once it is added, it is especially important for the first stage circuit to add as little noise as possible in order to obtain a high signal-to-noise ratio.

Even though it is a positive feedback circuit, the photo diode amplifier circuit will not oscillate if a low gain amplifier 30 with a gain of 1 or less is used since the open loop gain of the circuit is less than 1.0. As stated above, the open loop gain is the product of the gain of the low gain amplifier 30 and the gain of the feedback gain circuit. The gain of the feedback gain circuit in the photo diode amplifier is expressed as:

$$\text{Gain} = \frac{S \times C_f \times R}{(S \times C_f \times R) + 1}$$

where $S=2\pi$ (frequency), $C_f$ is the capacitance value of the feedback capacitor, and R is the resistance of the second stage circuit. As the above equation shows, the gain of the feedback gain circuit will always be less than one. If a low gain amplifier 30 with a gain of 1 or less is used, such as a unity gain amplifier, the open loop gain at all frequencies will be less than one and the photo diode amplifier circuit 300 will not oscillate.

Figure 4:
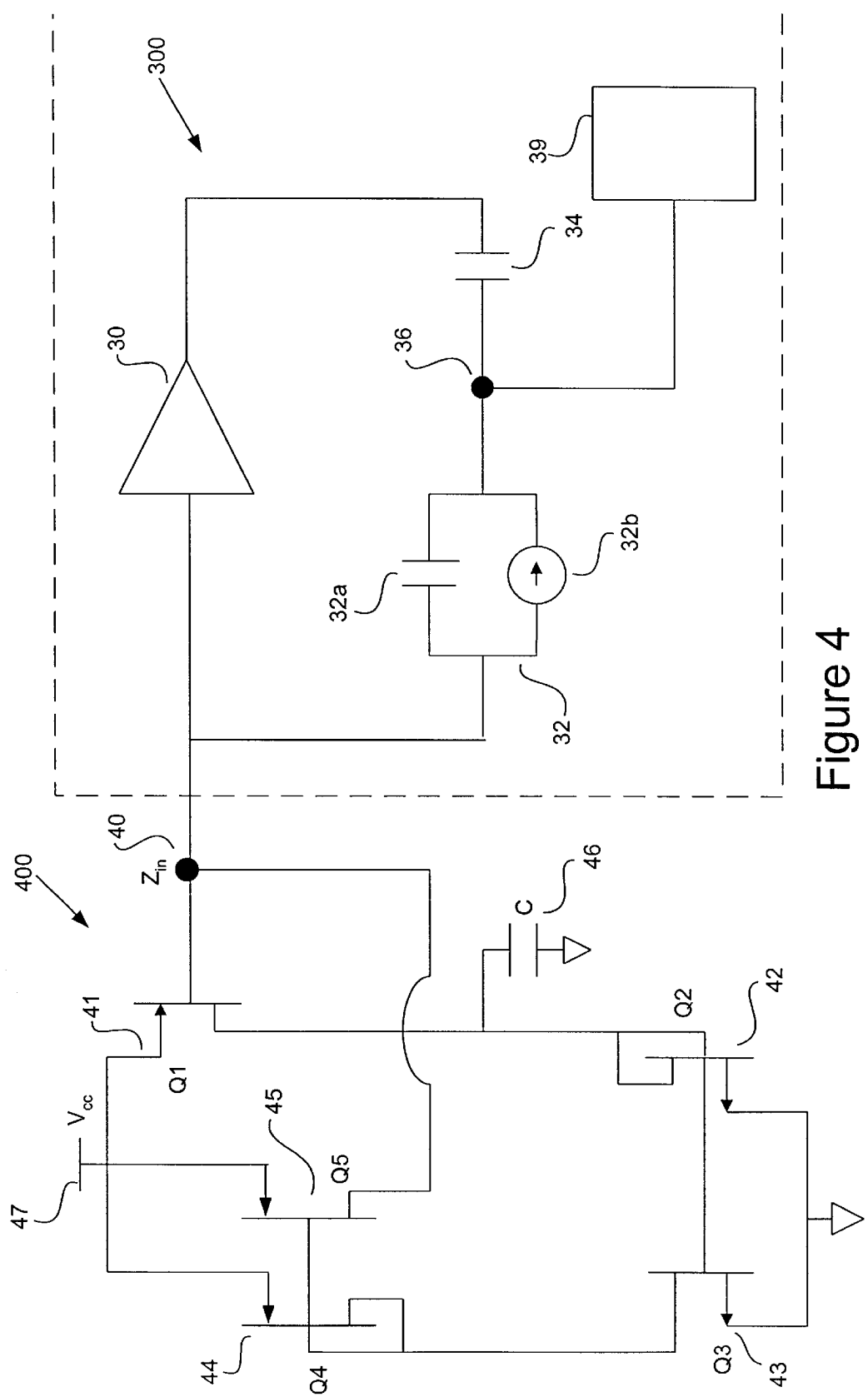
FIG. 4 is a diagram of a high impedance circuit coupled to the photo diode amplifier of FIG. 3.

Referring to FIG. 4, an alternative embodiment of the present invention is shown wherein a high impedance circuit 400 is coupled to the photo diode amplifier 300. The high impedance circuit 400 has an associated input impedance $Z_{in}$, as viewed from input node 40, and is comprised of a feedback loop that has an input transistor 41 whose gate is coupled to the input node 40 of the low gain amplifier 30 and an output transistor Q5 45 whose drain supplies current to the input node of the photo diode amplifier 300 in accordance with the voltage on the input node 40. In a preferred embodiment the high impedance circuit is formed by three p-channel FET transistors 41, 44, 45, two n-channel FET transistors 42, 43, and a capacitor C 46; however the exact design of the high impedance circuit and the number of transistors in it may vary considerably in other embodiments.

Referring back to FIG. 3, the high impedance circuit 400 is coupled between the power supply 37 and the photo diode amplifier 300 replacing resistor R1 38. The high impedance circuit 400 is used to bias and extend the low frequency cut-off of the photo diode amplifier 300 to lower frequencies (i.e., reduce the low frequency cut-off) than can be achieved using the circuit of FIG. 3. For the photo diode amplifier 300 to be biased correctly, the resistance value of resistor R1 38 must be low enough to allow adequate voltage from the power supply 37 to reach the photo diode amplifier 300. However, a low resistance value for resistor R1 38 will not provide an adequate low frequency 3 dB cut-off in the photo diode amplifier, which is determined by the equation:

$$\text{low frequency 3 dB cut-off} = \frac{1}{2\pi R1 \times C_{pd}}$$

where $C_{pd}$ is the capacitance value of the photo diode 32. A high resistance value for R1 38 would provide a low cut-off frequency in the photo diode amplifier 300, but that would be in conflict with the requirement that the resistance value of R1 38 be low enough to allow proper biasing of the photo diode amplifier 300. By replacing resistor R1 38 with the high impedance circuit 400, a high input impedance can be provided, allowing the low frequency cut-off to be extended to lower frequencies while also allowing correct biasing of the photo diode amplifier 300.

Referring to FIG. 4, a first transistor Q1 41 is coupled to the photo diode amplifier 300 at the gate terminal of transistor Q1 and to a power supply 47 at the source terminal of transistor Q1. The drain terminal of the first transistor Q1 41 is coupled to a capacitor C 46 and to the drain terminal of a second transistor Q2 42. The second transistor Q2 42 is coupled to a third transistor Q3 43 with the source terminals of both transistors Q2 42, Q3 43 connected to circuit ground (or other fixed potential circuit node). The drain of the third transistor Q3 43 is coupled to the gate and drain terminals of a fourth transistor Q4 44. The fourth transistor Q4 is coupled to a fifth transistor Q5 45, with the source terminals of both transistors Q4, Q5 connected to the power supply 47 and the gates of both transistors Q4, Q5 being connected to the drain terminal of transistor Q3. Transistor Q5 mirrors the current in transistor Q4, which is governed by transistor Q3 in accordance with the current produced by the photo diode 32.

The gate terminal of the first transistor Q1 41 senses the voltage produced at the cathode of the photo diode 32 in the photo diode amplifier 300 while the fifth transistor Q5 supplies the photo diode 32 with current. If the fifth transistor Q5 does not supply the photo diode 32 with enough current, the feedback loop formed by transistors Q1 to Q5 (41 to 45) forces the fifth transistor Q5 45 to provide more current.

The capacitor C 46 is used to increase the impedance of the high impedance circuit 400. The impedance $Z_{in}$ looking into the high impedance circuit 400 is calculated as:

$$Z_{in} = \frac{S \times C}{gm1 \times gm5} \| R5_{out}$$

where $S=2\pi$ (frequency), gm1 is the transconductance of the first transistor Q1 41, gm5 is the transconductance of the fifth transistor Q5 45, $R5_{out}$ is the output impedance of the fifth transistor Q5 45, and "A∥B" represents the impedance of two parallel impedance elements:

$$A \| B = \frac{A \times B}{A + B}.$$

Since the variable S varies with frequency, the input impedance $Z_{in}$ of the high impedance circuit 400 also varies with frequency. At low frequencies, $Z_{in}$ is approximately equal to (S*C)/(gm1*gm5), while at high frequencies $Z_{in}$ is approximately equal to $R5_{out}$. Assuming the inductive term (S*C)/(gm1*gm5) dominates at low frequencies, the low frequency 3 dB cut-off is determined by the equation:

$$\text{low frequency 3 dB cut-off} = \frac{1}{2\pi \sqrt{\frac{C \times C_{pd}}{gm1 \times gm5}}}$$

where $C_{pd}$ is the capacitance value of the photo diode 32 and C is the capacitance of capacitor C 46. However, if the capacitance value of capacitor C 46 is made large enough, the resistive term $R5_{out}$ will dominate and the low frequency 3 dB cut-off will be determined by the equation:

$$\text{low frequency 3 dB cut-off} = \frac{1}{2\pi R5_{out} \times C_{pd}}.$$

These equations show that the low frequency cut-off of the photo diode amplifier 300 is governed by the capacitance C of capacitor 46 and the output resistance R5 of transistor Q5 of the high impedance circuit 400. Thus, the low frequency cut-off can be explicitly controlled by selecting the size of capacitor 46 and by sizing transistor Q5 to control its output resistance R5.

In an alternative embodiment of the high impedance circuit, one or more cascode transistors can be cascaded in series and coupled between the fifth transistor Q5 45 and the photo diode amplifier 300 to increase the effective impedance of the fifth transistor Q5 45 and high impedance circuit 400. The higher input impedance provided by this alternative embodiment circuit further extends the low frequency cut-off of the photo diode amplifier 300 to even lower frequencies.

The high impedance circuit 400 allows adequate voltage to reach the photo diode amplifier 300 from the power supply 47. The voltage being supplied to the photo diode amplifier 300 is the voltage at the power supply 47 minus the gate-source voltage of the sense transistor Q1 41. Since gate-source voltage is normally less than 700 mV in FET transistors, the voltage supplied to the photo diode amplifier 300 is typically around $V_{cc}$–700 mV, which is large enough to bias the photo diode amplifier 300 correctly.

Therefore, the high impedance circuit 400 provides high input impedance $Z_{in}$ at node 40 while still allowing enough voltage to correctly bias the photo diode amplifier 300. The lower bandwidth extension (i.e., the low frequency cut-off) of the photo diode amplifier 300 is determined by the input impedance of transistor Q5 in the high impedance circuit 400, where a larger input impedance will provide a broader bandwidth. The impedance looking into the source or drain of a FET is inversely proportional to the square root of the ratio W/L (where W is the width of the FET's channel and L is the length of the FET's channel). Therefore, a smaller W/L ratio for transistor Q5 provides a higher impedance looking into the source or drain of the transistor Q5 (with the gate at a low impedance).

Lowering the low frequency cut-off of the photo diode amplifier 300 enables the photo diode amplifier 300 to amplify slow (i.e., low frequency) signals or signals with low frequency content (e.g., signals that have long strings of ones or zeroes).

Voltage Source to Current Source Converter

Figure 5:
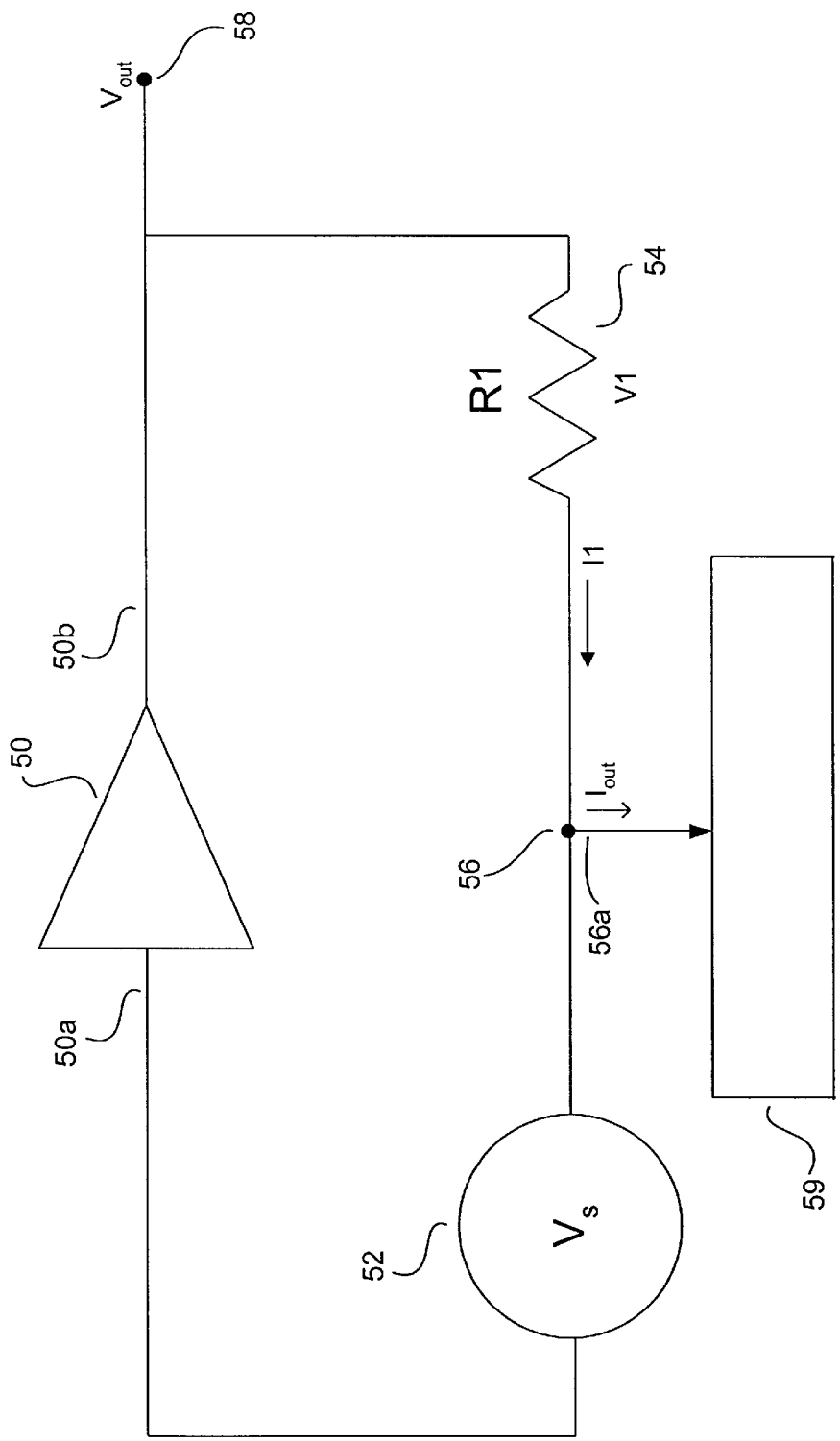
FIG. 5 is a diagram of a voltage source to current source converter and voltage amplifier utilizing a floating voltage source and a resistor as the feedback element in accordance with the present invention.

Referring to FIG. 5, a voltage source to current source converter is shown as a further embodiment of the present invention. The voltage source to current source converter is implemented using a low gain amplifier 50 with an input 50a and a output 50b, a floating voltage source 52, and a resistor R1 54 as a feedback element. The floating voltage source 52 and feedback resistor 54 are coupled at an output current node 56. In an alternative embodiment, the output terminal 50b of the low gain amplifier 50 is coupled to an output voltage node 58 that has an associated output voltage $V_{out}$.

The floating voltage source 52 produces a voltage $V_s$ that is impressed across the resistor R1 54 as voltage V1 due to the feedback system. The voltage across resistor R1 54 produces a current I1 equal to V1/R1. The current I1 does not flow back into the floating voltage source 52 due to the high impedance of the low gain amplifier 50. Therefore, current I1 flows from the output current node 56 as output current $I_{out}$ 56a to a second stage circuit 59, which preferably has a low input impedance.

The voltage source to current source converter can be used with any second stage circuit 59 requiring a current input. At the second stage circuit 59, the output current $I_{out}$ 56a can be further amplified to a useable level or it can be used as a current reference or a bias current since the output current $I_{out}$ 56a is a voltage independent current source. For example, in GaAs circuits it is normally difficult to implement a voltage independent current source because the p-type devices required by such current sources can not be used in circuits manufactured using GaAs processes. The voltage source to current source converter of the present invention provides a voltage independent current source that may be implemented using n-type devices and, therefore, may be used in circuits manufactured using GaAs processes.

In an alternative embodiment, the circuit shown in FIG. 5 may be implemented using a capacitor C coupled between the voltage source to current source converter and the second stage circuit 59 to AC couple the voltage source to current source converter to the second stage circuit 59.

In another alternative embodiment, the circuit shown in FIG. 5 may be implemented using a diode with an associated voltage drop $V_D$ coupled between the voltage source to current source converter and the second stage circuit 59 to create a set voltage drop between the voltage source to current source converter and the second stage circuit 59.

The circuit shown in FIG. 5 can also be implemented as a voltage source amplifier by using output voltage node 58, coupled to the low gain amplifier output 50b, as the output of the circuit. When implemented as such, the second stage circuit 59 preferably consists of a resistor R2 coupled to circuit ground (or other fixed potential circuit node). In this embodiment, a current $I_{out}$ flows through resistor R2 with a value equal to the current I1 through resistor R1 54 so that $I_{out}$=I1=V1/R1. Therefore, the voltage V2 across resistor R2 is equal to (V1/R1)*R2. The voltage $V_{out}$ at the output voltage node 58 is equal to the sum of V1 and V2 and is expressed by the equation:

$$V_{out}=V1+(V1/R1)*R2=V1(1+R2/R1)$$

Since the voltage $V_s$ produced by the floating voltage source 52 is equal to V1, the above equation shows that the voltage $V_{out}$ produced at the output voltage node 58 is an amplification of the floating voltage source $V_s$ by a factor of (1+R2/R1) or ((R1+R2)/R1).

Power Supply Independent Current Source

Figure 6:
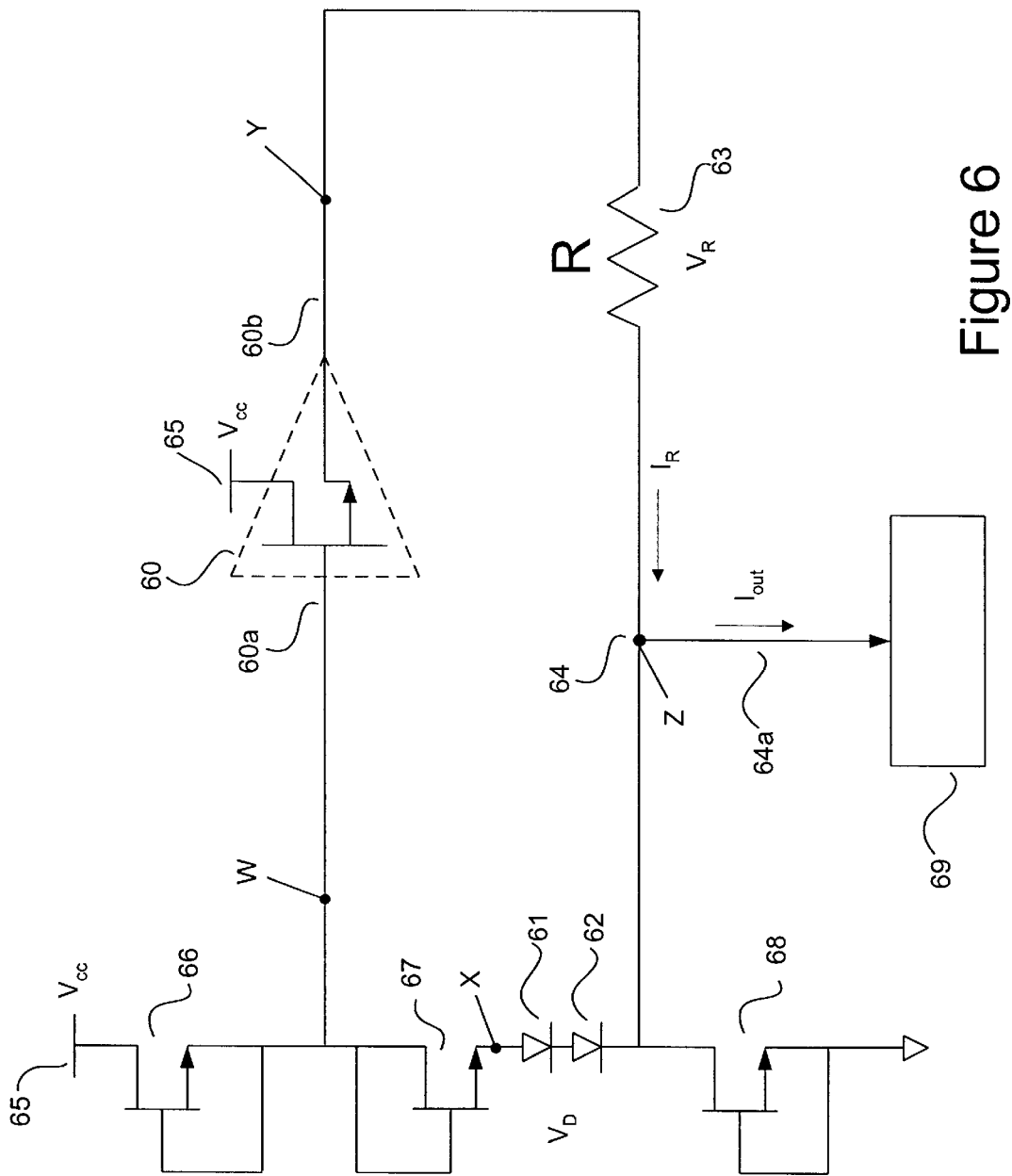
FIG. 6 is a diagram of a power supply independent current source utilizing a diode set as the floating signal source and a resistor as the feedback element in accordance with the present invention.

FIG. 6 shows a power supply independent current source in accordance with the present invention. The power supply independent current source has a positive feedback system that includes a unity gain amplifier 60 (consisting of a single transistor in a preferred embodiment) with an input or gate terminal 60a and an output or source terminal 60b, a first diode 61 in series with a second diode 62 as a floating "signal source," and a resistor R 63 as a feedback element. The second diode 62 and the resistor R 63 are coupled at an output current node 64 from which an output current $I_{out}$ 64a flows to a second stage circuit 69. More generally, the power supply independent current source includes a diode set 61–62 having at least one diode and no more than four diodes coupled in series as the floating source producing a voltage drop $V_D$.

The voltage independent current source also includes a power supply node 65 (for providing power to the circuit from a power supply) coupled to an input terminal of the unity gain amplifier 60 and to a drain terminal of a first n-channel FET transistor 66. A second n-channel FET transistor 67 is coupled in series with the first FET transistor 66 and the diode set 61–62 and has a drain terminal coupled to the input terminal 60a of the unity gain amplifier 60. A third n-channel FET transistor 68 is coupled in series with the diode set 61–62 and has a source terminal coupled to circuit ground (or other fixed potential circuit node).

The gate and source terminals of the first FET transistor 66 are shorted to create a current source that provides current to the diode set 61–62 and to the second transistor 67. The gate and source terminals of the third FET transistors 68 are also shorted to create a current source that pulls current away from the diode set 61–62. The gate and drain terminals of the second transistor 67 are shorted to create a voltage drop to offset the voltage drop of the unity gain amplifier 60.

The voltage drop VR across the resistor R 63 is forced to be equal to the voltage drop $V_D$ across the diode set 61–62 by the feedback system. This can be shown by the following analysis. Referring to FIG. 6, the voltage at point W is equal to the sum of the voltage at point X and the offset voltage of the second FET transistor 67. The voltage at point Y is equal to the voltage at point W minus the offset voltage of the unity gain amplifier 60. Since the offset voltage of the unity gain amplifier 60 is equal to the offset voltage of the second FET transistor 67, the voltage at point Y is equal to the voltage at point X.

The voltage at point Z is equal to the voltage at point X minus the voltage drop $V_D$ across the diode set 61–62. The voltage at point Z is also equal to the voltage at point Y minus the voltage drop $V_R$ across the resistor R 63. Since the voltage at points X and Y are equal, the voltage drops $V_D$ and $V_R$ must also be equal.

Therefore, the current $I_R$ through the resistor R 63 is equal to $V_R$/R or $V_D$/R. Current signal $I_R$ flows into point Z along with the current signal $I_{F1}$ produced by the first FET transistor 66. The current signal $I_{F3}$ produced by the third FET transistor 68 flows away from point Z as does the current $I_{out}$ that flows to the second stage circuit 69. By Kirchhoff's Law, the sum of the current flowing into point Z must be equal to the sum of the current flowing out of point Z. Therefore, the sum of the currents $I_R$ and $I_{F1}$ must be equal to the sum of the currents $I_{out}$ and $I_{F3}$. Since the first and third FET transistors 66, 68 are identical, the current signals $I_{F1}$ and $I_{F3}$ produced by the transistors are equal. Therefore, currents $I_R$ and $I_{out}$ are equal.

Since current $I_{out}$ is equal to $I_R$, current $I_{out}$ is equal to $V_D$/R. Therefore, current $I_{out}$ is independent of the power supply $V_{cc}$ 65 since it relies only on the voltage drop $V_D$ across the diode set 61–62. Generally, the voltage drops supplied by the diodes 61–62 vary much less (in response to changes in temperature, supply voltage, manufacturing process variations, etc.) than voltage drops supplied by transistors. Since current $I_{out}$ relies only on diode voltage drops, it is also free from large variations.

The power supply independent current source of the present invention is especially useful in circuits manufactured using GaAs processes. As explained above, a power supply independent current source is normally difficult to build since the p-type devices normally required by such current sources cannot be used in GaAs circuits. The power supply independent current source of the present invention uses only n-type devices and therefore may be made entirely from GaAs circuit components.

The power supply independent current source of the present invention can be used with any second stage circuit 69 requiring a current input. At the second stage circuit 69, the output current $I_{out}$ 64a can be further amplified or it can be used as a current reference or a bias current since the output current $I_{out}$ 64a is a power supply independent current source.

Alternative embodiments of the present invention can also be created by using one diode or three or more diodes in place of the two diodes in the diode set 61–62 for the floating signal source. Alternative embodiments can also be created by using other types of low gain amplifiers in place of the unity gain amplifier 60.

Embedded/Nested Positive Feedback Circuit Stages

Figure 7:
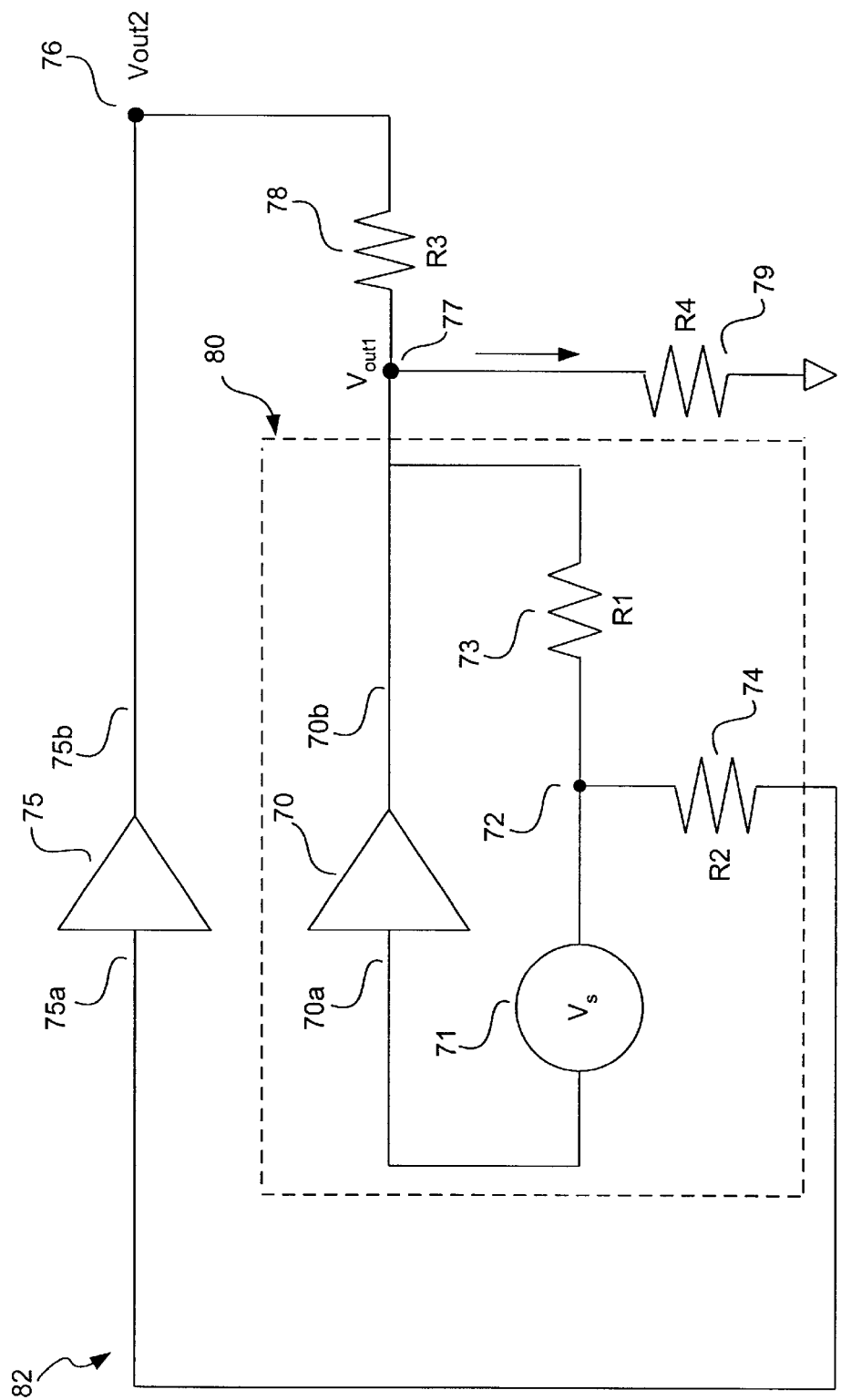
FIG. 7 is a diagram of an embedded circuit utilizing the voltage source amplifier of FIG. 5.

The signal processing circuits of the present invention can also be embedded or nested in multiple stages of signal processing to acquire multiple stages of gain or to create more complex functions. FIG. 7 shows an example of how the voltage source amplifier of FIG. 5 can be embedded to produce another stage of gain. The embedded voltage source amplifier includes an inner voltage source amplifier 80 and an outer voltage source amplifier 82.

The inner voltage source amplifier 80 includes a first low gain amplifier 70 with an input 70a and an output 70b, a floating voltage source 71 producing a voltage $V_s$, a first resistor R1 73 as a feedback element, and a second resistor R2 74 as an inner second stage circuit. The floating voltage source 71 and first resistor 73 are coupled at a first output current node 72 that is coupled to the second resistor R2 74. The output 70b of the first low gain amplifier 70 is coupled to a first output voltage node 77 that has an associated output voltage $V_{out1}$.

The outer voltage source amplifier 82 includes a second low gain amplifier 75 with an input 75a and an output 75b, the inner voltage source amplifier 80 as a floating voltage source producing a voltage $V_{out1}$, a third resistor R3 78 as a feedback element, and a fourth resistor R4 79 as a outer second stage circuit. The inner voltage source amplifier 80 and the third resistor R3 78 are coupled at a second output current node 77 (which is also the first output voltage node 77). The fourth resistor R4 79 is coupled to the second output current node 77 and coupled to circuit ground (or other fixed potential circuit node). Alternately, the fourth resistor R4 is coupled to an additional embedded circuit instead of being coupled to the circuit ground. The outer voltage source amplifier 82 provides the additional embedded circuit a current signal that is an amplified version of the input signal from the floating voltage source 71. The output 75b of the second low gain amplifier 75 is coupled to a second output voltage node 76 that has an associated output voltage $V_{out2}$.

As shown above, each voltage source amplifier amplifies the floating voltage source signal by a gain factor of $((R_x+R_y)/R_x)$ where $R_x$ is the feedback resistor and $R_y$ is the second stage circuit resistor that is coupled to the floating voltage source and the feedback resistor $R_x$. Therefore, the inner voltage source amplifier produces a gain factor of $((R1+R2)/R1)$ and the outer voltage source amplifier produces a gain factor of $((R3+R4)/R3)$. The total gain of the embedded circuit as measured by the ratio $V_{out2}/V_s$ would be the product of the two gain factors or $((R1+R2)/R1)*((R3+R4)/R3)$.

Several embodiments of the present invention may be implemented using gallium arsenide (GaAs) metal-semiconductor field-effect transistors (MESFETs). In other embodiments, the circuits and signal processing methods of the present invention may be implemented using bipolar and complementary metal-oxide silicon or BiCMOS circuitry.

Alternative embodiments of the present invention can also be created by embedding three or more signal processing circuits to obtain greater gain factors or more complex functions.

Alternative Embodiments

Current Source to Current Source Converter

Figure 8:
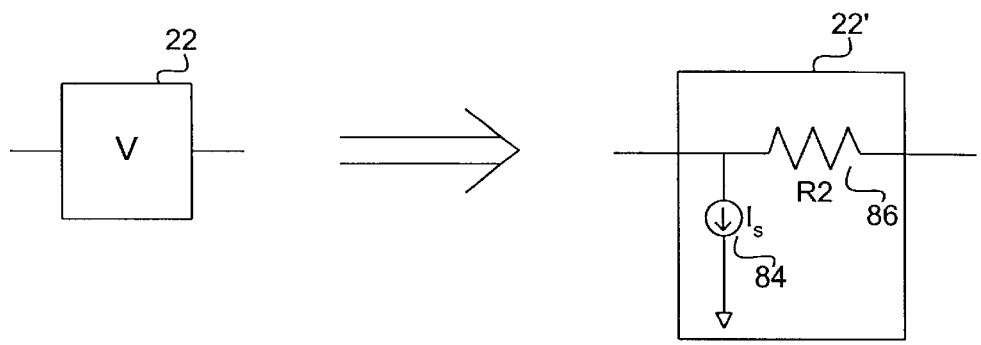
FIG. 8 is a diagram of an alternative embodiment of the floating signal source for use in a current source to current source converter.

FIG. 8 shows a diagram of an alternative embodiment of the floating signal source 22 shown in FIG. 2. An alternative source 22' has a current source 84 producing a current $I_s$ and a resistor R2 86. The current source 84 is coupled to the resistor R2 86 on one end and coupled to circuit ground (or other fixed potential circuit node) on its other end. The alternative source 22' is used in the positive feedback circuit of FIG. 2. to implement a current source to current source converter. The current source to current source converter also includes a resistor R1 as a feedback element (24 of FIG. 2). The current source to current source converter produces an output current $I_{out}$ (26a of FIG. 2) that is equal to the current source current $I_s$ amplified by a factor of R2/R1 and can be represented by the equation: $I_{out}=(R2/R1)*I_s$.

Integrator Circuit

Figure 9:
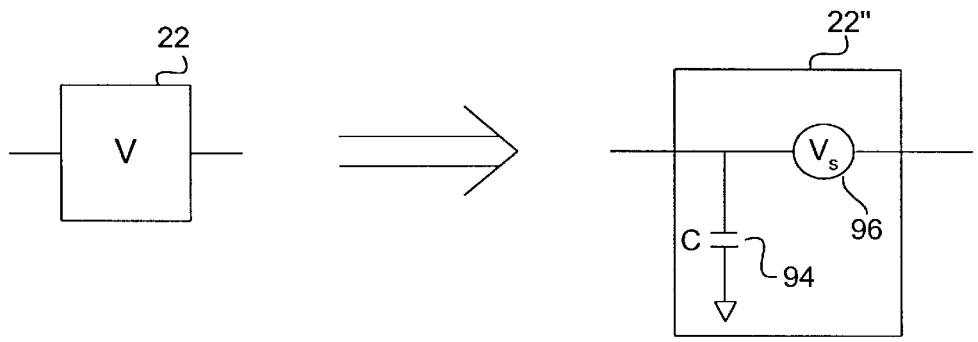
FIG. 9 is a diagram of an alternative embodiment of the floating signal source for use in an integrator circuit.

FIG. 9 shows a diagram of an alternative embodiment of the floating signal source 22 shown in FIG. 2. An alternative source 22" has a voltage source 96 producing a voltage $V_s$ and a capacitor C 94. The capacitor C 94 is coupled to the voltage source 96 on one end and coupled to circuit ground (or other fixed potential circuit node) on its other end. The alternative source 22" is used in the positive feedback circuit of FIG. 2. to implement an integrator circuit. The integrator circuit also includes a resistor R as a feedback element (24 of FIG. 2). The integrator circuit produces an output voltage $V_{out}$ at the output voltage node (27 of FIG. 2) that is equal to the integration of the voltage source voltage $V_s$ divided by (R*C), where R is the resistance of the feedback element 24 and C is the capacitance of capacitor 94, and can be represented by the equation:

$$V_{out} = \frac{1}{RC}\int V_s.$$

Differentiator Circuit

Figure 10:
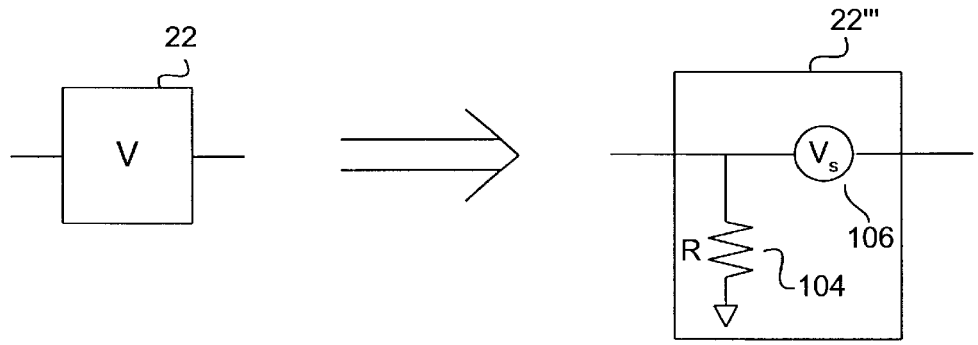
FIG. 10 is a diagram of an alternative embodiment of the floating signal source for use in a differentiator circuit.

FIG. 10 shows a diagram of an alternative embodiment of the floating signal source 22 shown in FIG. 2. An alternative source 22'" has a voltage source 106 producing a voltage $V_s$ and a resistor R 104. The resistor R 104 is coupled to the voltage source 106 on one end and coupled to circuit ground (or other fixed potential circuit node) on its other end. The alternative source 22'" is used in the positive feedback circuit of FIG. 2. to implement a differentiator circuit. The differentiator circuit also includes a capacitor as a feedback element (24 of FIG. 2). The differentiator circuit produces an output voltage $V_{out}$ at the output voltage node (27 of FIG. 2) that is equal to the differentiation of the voltage source voltage $V_s$ multiplied by (R*C), where R is the resistance of resistor 104 and C is the capacitance of the capacitor feedback element 24, and can be represented by the equation:

$$V_{out} = RC\frac{d}{dt}V_S.$$

What is claimed is:

1. A signal processing circuit, comprising:
a low gain amplifier having an input and an output; and
a positive feedback circuit coupling the output of the low gain amplifier to the input of the low gain amplifier; the positive feedback circuit including a floating signal source and a feedback element coupled in series with the floating signal source at an output current node;
the floating signal source producing a voltage that is impressed across the feedback element and processed by the feedback element into an output current signal;
the output current node providing the output current signal to a second stage circuit.

2. The signal processing circuit of claim 1, further comprising:
an output voltage node coupled to the output of the low gain amplifier wherein the output voltage node provides an output voltage $V_{out}$.

3. The signal processing circuit of claim 1, wherein the low gain amplifier has a gain of at least 0.5 and no more than 2.

4. The signal processing circuit of claim 1, wherein the floating signal source is a photo diode that produces a current $I_{pd}$ and has an associated capacitance, $C_{pd}$.

5. The signal processing circuit of claim 4, wherein the feedback element is a capacitor with an associated capacitance, $C_f$.

6. The signal processing circuit of claim 5, wherein the output current signal includes a current component proportional to the photo diode current $I_{pd}$ amplified by the ratio of the capacitances $C_f/C_{pd}$.

7. The signal processing circuit of claim 5, further comprising:
a high impedance circuit coupled to the input of the low gain amplifier, for biasing the signal processing circuit and extending a low frequency cut-off of the signal processing circuit.

8. The signal processing circuit of claim 7, wherein the high impedance circuit includes:
a first transistor having a gate terminal coupled to the input of the low gain amplifier, a source terminal coupled to a power supply, and a drain terminal coupled to a capacitor C that is coupled to a fixed potential circuit node; and
a second transistor having a drain terminal coupled to the input of the low gain amplifier; the second transistor coupled to the first transistor so as to control current flow out the drain terminal of the second transistor in accordance with a voltage on the gate terminal of the first transistor.

9. The signal processing circuit of claim 4, further comprising:
a high impedance circuit coupled to the input of the low gain amplifier, for biasing the signal processing circuit and extending a low frequency cut-off of the signal processing circuit.

10. The signal processing circuit of claim 1, further comprising:
a high impedance circuit coupled to the input of the low gain amplifier, for biasing the signal processing circuit and extending a low frequency cut-off of the signal processing circuit.

11. The signal processing circuit of claim 10, wherein the high impedance circuit includes:
a first transistor having a gate terminal coupled to the input of the low gain amplifier, a source terminal coupled to a power supply, and a drain terminal coupled to a capacitor C that is coupled to a fixed potential circuit node; and
a second transistor having a drain terminal coupled to the input of the low gain amplifier; the second transistor coupled to the first transistor so as to control current flow out the drain terminal of the second transistor in accordance with a voltage on the gate terminal of the first transistor.

12. The signal processing circuit of claim 10, wherein the high impedance circuit includes:
a first transistor having a gate terminal coupled to the input of the low gain amplifier, a source terminal coupled to a power supply, and a drain terminal coupled to a capacitor C that is coupled to a circuit ground;
a second transistor having a gate terminal coupled to the capacitor C, a drain terminal coupled to the gate terminal, and a source terminal coupled to the circuit ground;
a third transistor having a gate terminal coupled to the gate terminal of the second transistor and a source terminal coupled to the circuit ground;
a fourth transistor having a drain terminal and a gate terminal coupled to a drain terminal of the third transistor and a source terminal coupled to the power supply; and
a fifth transistor having a gate terminal coupled to the gate terminal of the fourth transistor, a source terminal coupled to the power supply, and a drain terminal coupled to the input of the low gain amplifier.

13. The signal processing circuit of claim 1, wherein the feedback element includes a resistor with resistance value R, the floating signal source produces a voltage $V_s$, and the output current signal includes a current component proportional to $V_s/R$.

14. The signal processing circuit of claim 1, wherein the output of the low gain amplifier provides an output voltage $V_{out}$ that is an amplified version of the voltage $V_s$ produced by the floating voltage source, and the second stage circuit comprises a resistor coupled to a fixed potential circuit node.

15. The signal processing circuit of claim 1, wherein the floating signal source comprises a diode set that produces a voltage drop $V_D$.

16. The signal processing circuit of claim 15, wherein the feedback element is a resistor with resistance value R.

17. The signal processing circuit of claim 15 including:
a power supply coupled to a first transistor;
a second transistor coupled to the first transistor, the input of the low gain amplifier and the diode set;
and a third transistor coupled between the diode set and a fixed potential circuit node.

18. The signal processing circuit of claim 17, wherein the output current signal is determined by the equation $V_D/R$.

19. The signal processing circuit of claim 15 wherein the diode set is one or more diodes.

20. The signal processing circuit of claim 15 wherein the low gain amplifier is a unity gain amplifier.

21. The signal processing circuit of claim 1, wherein the floating signal source is a sensor.

22. The signal processing circuit of claim 1, wherein the floating signal source is a microphone.

23. The signal processing circuit of claim 1, wherein the floating signal source is a disk drive sensor.

24. The signal processing circuit of claim 1, wherein the feedback element is an inductor.

25. The signal processing circuit of claim 1, wherein the feedback element is a diode.

26. A signal processing circuit, comprising:
   a low gain amplifier having an input and an output; and
   a positive feedback circuit coupling the output of the low gain amplifier to the input of the low gain amplifier; the positive feedback circuit including a signal source and a feedback element coupled in series with the signal source at an output current node;
   the signal source producing a voltage that is impressed across the feedback element and processed by the feedback element into an output current signal;
   the output current node providing the output current signal to a second stage circuit.

27. The signal processing circuit of claim 26 wherein the feedback element includes a first resistor with resistance value R1 and the signal source comprises a current source producing a current $I_s$ and a second resistor with resistance value R2, the current source being coupled to the input of the low gain amplifier, and the second resistor being coupled to the output current node and to the input of the low gain amplifier.

28. The signal processing circuit of claim 27, wherein the output current signal includes a current component proportional to the current source current $I_s$ amplified by the ratio of the resistors R2/R1.

29. The signal processing circuit of claim 26 wherein the feedback element includes a resistor and the signal source comprises a capacitor and a voltage source producing a voltage $V_s$, the capacitor being coupled to the input of the low gain amplifier, and the voltage source being coupled to the output current node and to the input of the low gain amplifier.

30. The signal processing circuit of claim 29, wherein the output of the low gain amplifier provides an output voltage $V_{out}$ that is an integrated version of the voltage $V_s$ produced by the voltage source.

31. The signal processing circuit of claim 26 wherein the feedback element includes a capacitor and the signal source comprises a resistor and a voltage source producing a voltage $V_s$, the resistor being coupled to the input of the low gain amplifier, and the voltage source being coupled to the output current node and to the input of the low gain amplifier.

32. The signal processing circuit of claim 31, wherein the output of the low gain amplifier provides an output voltage $V_{out}$ that is a differentiated version of the voltage $V_s$ produced by the voltage source.

* * * * *

UNITED STATES PATENT AND TRADEMARK OFFICE
CERTIFICATE OF CORRECTION

PATENT NO. : 6,693,487 B2 Page 1 of 1
APPLICATION NO. : 09/925176
DATED : February 17, 2004
INVENTOR(S) : Philip D. Shapiro It is certified that error appears in the above-identified patent and that said Letters Patent is hereby corrected as shown below:

Column 7,
Line 15, Change "$Cf$" to --$C_f$--
Line 17, Change "$Cf$" to --$C_f$--
Line 41, Change "$Vf$" to --$V_f$--
Line 43, Change "$If$" to --$I_f$--
Line 53, Change "$If$" to --$I_f$--

Column 8,
Line 38, Insert --,-- after "In a preferred embodiment"

Column 10,
Line 13, Change "cascode transistors" to --cascade transistors--

Column 12,
Line 17, Change "VR" to --$V_R$--

Column 13,
Line 36, Change "as a outer" to --as an outer--

Column 16,
Claim 11, Line 11, Insert --of-- before "the drain terminal"

Signed and Sealed this

Thirtieth Day of January, 2007

JON W. DUDAS
*Director of the United States Patent and Trademark Office*